United States Patent [19]

Carbrey

[11] 4,037,117
[45] July 19, 1977

[54] PEAK SHUT-OFF ELECTRONIC SWITCH

[75] Inventor: Robert Lawrence Carbrey, Boulder, Colo.

[73] Assignee: Bell Telephone Laboratories, Incorporated, Murray Hill, N.J.

[21] Appl. No.: 666,793

[22] Filed: Mar. 15, 1976

[51] Int. Cl.² .......................................... H03K 17/72
[52] U.S. Cl. ........................... 307/252 N; 179/15 AT; 307/237; 307/253; 323/225 C
[58] Field of Search ............... 307/252 N, 252 C, 218, 307/237, 251, 246, 253, 235 A; 179/18 F, 18 HB, 15 AT, 1 P, 84 R; 323/225 C

[56] References Cited
U.S. PATENT DOCUMENTS 3,217,176  11/1965  Chin ..................................... 307/218
3,240,916  3/1966  Bray et al. ....................... 307/252 N Primary Examiner—John Zazworsky
Attorney, Agent, or Firm—Charles Scott Phelan

[57] ABSTRACT

A control transistor and a pnpn device are arranged in serial combination with each other, as well as with a source of alternating current and a load. The transistor and pnpn device in combination behave as a two-state semiconductor switch for switching cyclically varying currents and voltages of amplitude greater than the punch-through voltage limit of the transistor. The switch conducts an unrectified, cyclically varying waveform by operation of a diode biasing scheme. Circuitry responsive to voltage peaks of the source causes the transistor to periodically open the circuit for a short duration, thereby discontinuing the transmission of energy to the load within a fraction of a cycle after a discontinuation command signal is received.

18 Claims, 2 Drawing Figures

PEAK SHUT-OFF ELECTRONIC SWITCH

BACKGROUND OF THE INVENTION

1. Field of the Invention

This invention relates to semiconductor switching circuits of the variety that switch high-voltage alternating currents. More particularly, this invention relates to telephone ringing circuits which control the conduction of ringing signals to individual subscriber stations.

2. Description of the Prior Art

It is well known that semiconductor switching devices, particularly bipolar transistors, have limited applicability in high-voltage switching circuits. Excessive collector-emitter voltages can cause collector-emitter conduction without base drive; a destructive operating mode known as punch-through. It is also known that pnpn devices can safely sustain across their anode and cathode terminals greater voltages than the punch-through voltage levels of transistors.

Generally, semiconductor pnpn devices can be viewed as operating in any of four progressively increasing anode-cathode voltage regions. In a first region wherein anode-cathode voltage is well below the maximum instantaneous voltage which will not switch the device into the "on" state without gate drive, i.e., forward blocking potential, anode-cathode conduction can be initiated only upon the application of adequate gate drive. Conduction of current through the device in this first operating region is below the device's holding level and thus conduction is extinguished upon the discontinuation of the gate drive signal. In a second oerating region wherein anode-cathode voltage is below the forward blocking potential of the device, but greater than that applied in the first region, conduction of current through the device is initiated upon the application of adequate gate drive. In this operating region, however, discontinuation of the gate drive will not extinguish the current through the device, as the current therethrough is greater than the device's holding current level. Anode-cathode current is extinguished by an externally-induced interruption of the current, and the device will remain off if the gate drive has been discontinued.

A third operating region is defined by anode-cathode voltage in excess of the forward blocking potential, but less than the device-destructive peak forward voltage (PFV) rating of the device. Application of such a voltage causes nondestructive conduction of anode-cathode current without external gate drive. The fourth and final operating region is defined by anode-cathode voltages in excess of the PFV; destructive conduction ensues. In both the third and fourth operating regions conduction occurs irrespective of the absence of gate control signals, and, therefore, operation in these regions is unsuitable for controlled switching functions.

The pnpn devices employed in this invention and in the relevant prior art are operated in second operating region. Control signals applied to the gate of the device effectively control the initiation of conduction, but once the device is in conduction it cannot be extinguished by gate control alone. Some means external to the device must be employed to reduce the current to a level below the device's minimum holding level. In essence, the device is extinguishable when it is biased in such a manner as to cause it to operate in the first operating region described hereinabove.

Thus, it is apparent that a first task facing the designer of switching circuits employing pnpn devices lies in solving the shut-off problems associated with these devices as a result of the "latching" effect inherent in the second operating region. The prior art has thrust at the problem with two circuit design techniques, each employing similar circuit structures but differing operative principles. The first method employs a second switching device, illustratively a bipolar transistor, in series combination with the pnpn device. By conventionally shutting off the bipolar transistor, the current through both itself and the serial pnpn device is thereby extinguished. This method, however, has the disadvantage of applying the full supply potential across the open bipolar transistor, thereby limiting the supply voltage to not exceed the transistor's punch-through level. In a more sophisticated manner, the second method employs the series bipolar transistor as a biasing agent. Conventionally signalling the bipolar transistor to begin to shut off causes the anode-cathode current through the pnpn device to diminish and the gate-cathode terminals to reverse bias. The combined effect of the diminished current and reverse-biased gate causes the pnpn device to extinguish itself not only before the bipolar transistor completely shuts off, but also before the voltage across the bipolar transistor reaches the punch-through level.

A second problem facing semiconductor switching circuit designers is that of switching unrectified alternating currents. Pnpn devices operating in the second region behave in several ways like conventional pn diodes. Conventional current is conducted in the forward-biased, anode-cathode direction, but not in the reverse-biased, cathode-anode direction. Full-wave alternating current switching has heretofore been relegated to electromechanical relays, bidirectional semiconductor devices such as triacs, and circuit schemes containing multiple pnpn devices.

It is, therefore, an object of this invention to improve solid-state switches employing a single pnpn device in series with a load for switching cyclically varying currents It is another object of this invention to switch a cyclically varying signal of sufficiently elevated amplitude that device-destructive collector-emitter conduction without base drive would be induced in bipolar transistors were the cyclically varying signal applied directly across the collector and emitter terminals.

It is a further object of this invention to switch off and thereby discontinue a high-voltage, cyclically varying current within a fraction of a cycle after the time that a discontinuation command signal is provided.

SUMMARY OF THE INVENTION

An illustrative embodiment of this invention overcomes the above-indicated problems of the prior art by shifting the average voltage level of the switch away from relative zero, while simultaneously cancelling the direct current component from the switching function. In this fashion, the switch conducts a cyclically varying signal from a source of alternating current to a load.

Shut-off problems associated with pnpn switching devices are substantially alleviated by the serial combination of a pnpn device with a second switching device. The second switching device is periodically opened for a short period of time by operation of control circuitry responsive to a periodic peak in the waveform of the signal from the alternating current source. In an illustrative embodiment, the polarity of the waveform peak which causes the second switching device to open is selected so that the second switching device opens when the cyclically varying signal flowing through the switch approaches the voltage level established by the voltage level shifting arrangement and closes within a short time after it opens. Thus, the second switching device experiences only a small increment of the cyclically varying signal voltage during its open interval, and is in a closed state with small voltage across its terminals during the high-voltage excursions. In an illustrative embodiment of this invention wherein the second switching device is a transistor, punch-through is avoided by the cancellation of the direct current component from the direct current source and the minimization of the cyclically varying voltage component during the transistor's open interval.

The inventive concept disclosed herein is not limited to semiconductor circuitry. Shut-off problems resulting from the latching characteristic are associated not only with pnpn semiconductor devices, but also with the thyratron family of electron tube devices. Moreover, a pnpn device or a thyratron may be in serial combination with a transistor as per the illustrative embodiment described in detail below, or some other second switching device such as a relay. The advantages provided by the peak shut-off concept described in this disclosure are applicable to relays when utilized as the second switching device and result in reduced contact wear.

It is a feature of this invention that not all of the subcircuits comprising the overall electronic switch need be replicated when a plurality of loads are serviced by a single alternating current supply. A single alternating current supply in serial combination with a hereinabove-described second switching device that is controlled by associated peak-responsive circuitry can service a plurality of primary switching devices, be they pnpn devices or thyratrons, and their associated loads. Similarly, the direct current supply to which are connected the transistor and pnpn devices via the clipping diodes will not require replication in multiple load arrangements of this concept.

BRIEF DESCRIPTION OF THE DRAWINGS

Comprehension of this invention is facilitated by reference to the following detailed description and its accompanying drawings in which.

DETAILED DESCRIPTION

Figure 1:
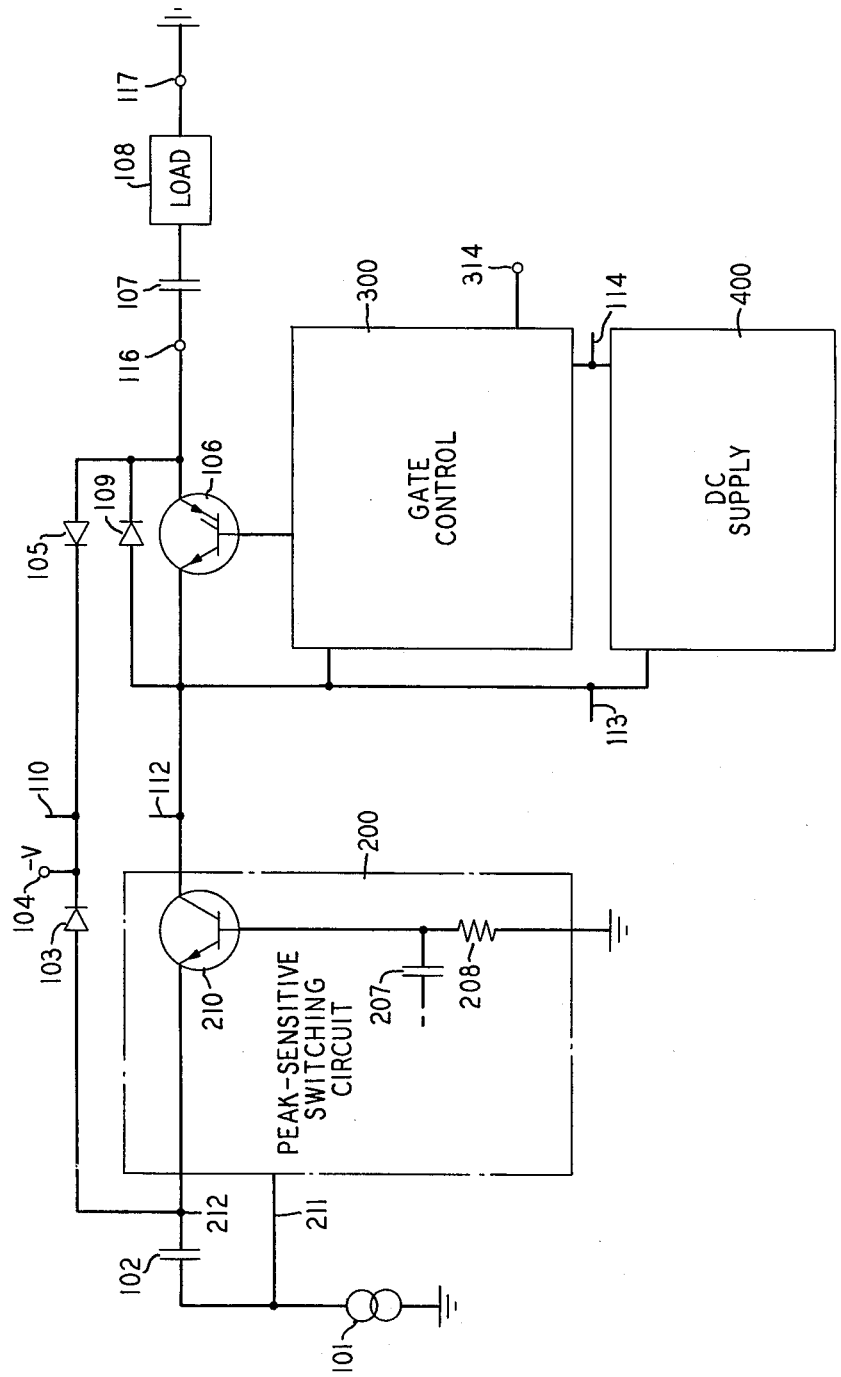
FIG. 1 is a simplified illustration, partially in schematic form and partially in block and line form, of an illustrative embodiment of the invention.

FIG. 1 is a simplified block and schematic illustration of a switch employing a pnpn device 106 as the principal switching element. During conduction, current flows through the primary current-carrying path comprising alternating current supply 101, capacitor 102, peak-sensitive switching circuit 200 (specifically transistor 210), pnpn device 106, capacitor 107, and load 108 to ground. Capacitor 107 is omitted in applications of this concept wherein the load is capacitive or otherwise incapable of drawing direct current. A typical telephone set which has a capacitor as part of its series load during ringing is an example of such a load.

Circuit node 212 in the primary current path of peak-sensitive switching circuit 200 and the anode terminal of the pnpn device are each connected by means of diodes 103 and 105, respectively, to a negative direct current supply (not shown) connected between point 104 and ground. Thus, the node and the anode terminal cannot bear voltages more positive than the direct current supply voltage plus the forward-biased diode junction voltage drop because the differential voltage will forward-bias diodes 103 and 105, and the excess charge on capacitors 102 and 107 will be conducted via the diodes to the supply at 104. In effect, these terminals are voltage limited to the voltage of the supply connected at 104 by the clipping action of diodes 103 and 105.

Figure 2:
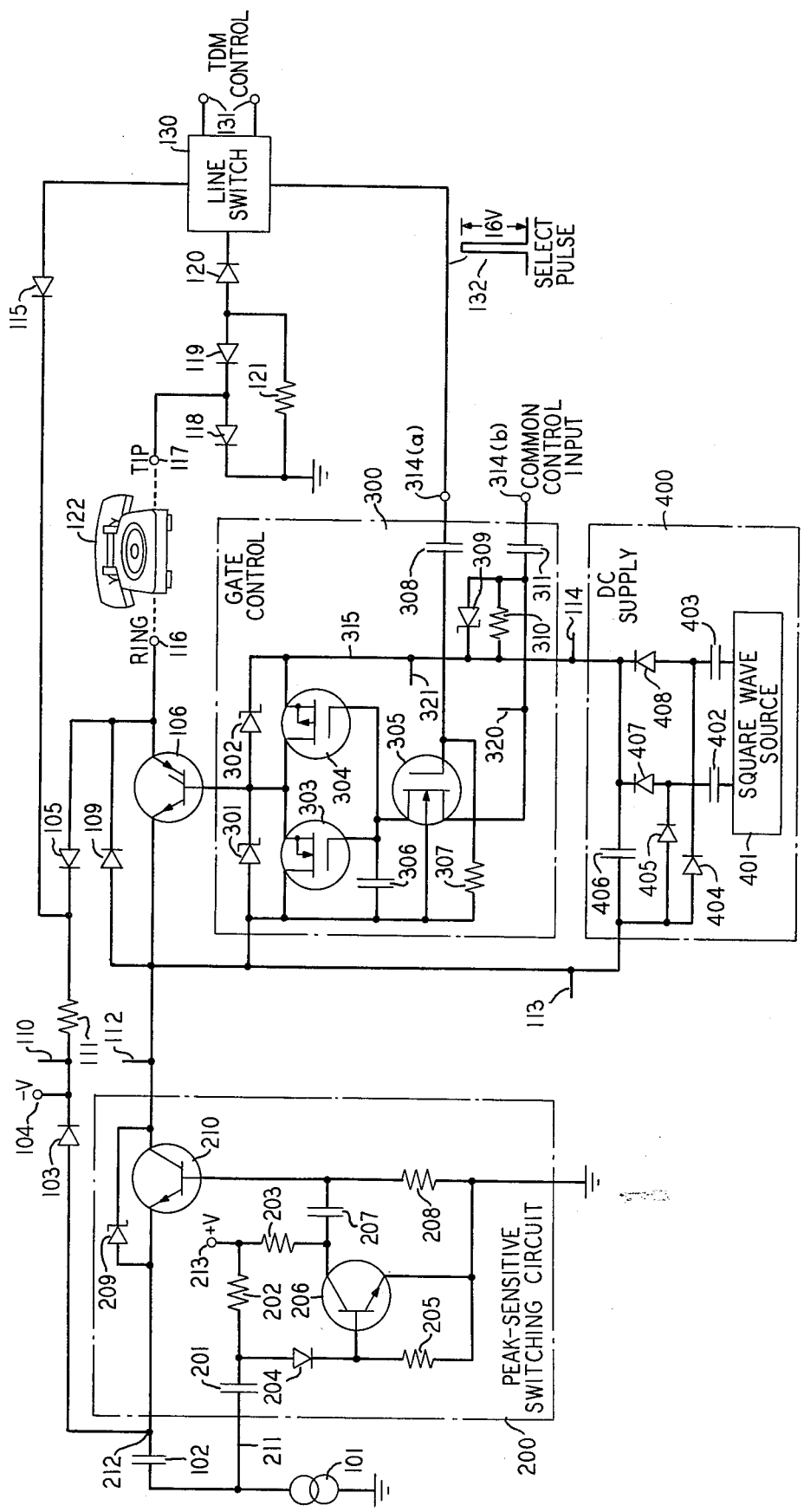
FIG. 2 is a schematic illustration of the circuit in FIG. 1 as embodied in a time-division multiplex (TDM) telephone ringing system.

Peak-sensitive switching circuit 200 shown in FIGS. 1 and 2 is a normally closed switch in the primary current path which opens in response to the positive voltage peaks from alternating current source 101. Conductor 211 connects the peak-sensitive switching circuit 200 to the source 101, thereby providing an electrical path by which the circuit senses the voltage at the source 101 and responsively opens the primary current path for a short duration on or about the positive voltage peak. The internal operating mechanics of an illustrative peak-sensitive switch will be described below; however, suffice for the moment with the knowledge that the function of this switching circuit is to momentarily open the primary current path upon detection of the periodic voltage peaks of source 101.

Similarly, illustrative embodiments of gate control circuit 300 and D.C. supply 400 will be described in detail below. In essence, the combined function of these two representative blocks is to provide on and off bias states for the gate and cathode terminals of pnpn device 106 in response to control signals placed at input 314. Thus, control signals at input 314 will determine whether the gate and cathode terminals of pnpn device 106 will be biased for conduction or shut-off.

DIODE-EFFECTED VOLTAGE CLAMPING ARRANGEMENT

The voltage clamping concept effected by diodes 103 and 105 and the direct current supply connected at 104 can be more easily explained if the effects of the peak-sensitive switch 200 and gate control circuit 300 are temporarily disregarded. Assume, therefore, that peak-sensitive switch 200 is constantly closed and that the gate of pnpn device 106 is forward-biased for conduction relative to the cathode terminal. Assume, also, that source 101 produces a 300-volt peak-to-peak signal alternating between +150 volts and −150 volts with respect to ground at 20 Hz and that a −48-volt direct current supply is connected between terminal 104 and ground. Junction voltage drops across the diodes will be ignored.

Sequential analysis of the circuit shown in FIGS. 1 and 2 shall begin at a point in time when the voltages produced by source 101 and the source at 104 are zero. The primary current-carrying path comprising the left side of capacitor 102, node 212, line tap 112, terminal 116 and terminal 117 is at ground potential. Applying −48 volts at terminal 104 with respect to ground causes diodes 103 and 105 to become forward biased because their respective cathodes are more negative than their anodes. Capacitors 102 and 107 discharge via diodes 103 and 105, respectively. After stabilization, capacitor 102 experiences ground potential on its left-hand terminal and approximately −48 volts on its right-hand terminal.

Similarly, capacitor 107 experiences approximately −48 volts on its left-hand terminal and ground potential on its right-hand terminal. Since it was initially assumed that peak-sensitive switching circuit 200 and pnpn device 106 are in the on state, that section of the primary current-carrying path between node 212 and terminal 116 bears −48 volts.

Energization of alternating current source 101 initially causes the voltage on the left-hand terminal of capacitor 102 to increase positively. The right-hand terminal remains at −48 volts because the excess charge is immediately conducted to the source at 104 via diode 103. When source 101 reaches its positive-most peak of +150 volts, capacitor 102 experiences +150 volts on its left-hand terminal and −48 volts on its right-hand terminal. Terminal 116 remains at −48 volts by operation of diode 105.

As source 101 begins its negative-going voltage excursion, the voltage on terminal 212 is driven further negative than the original −48 volts. Since the anode of diode 103 is now more negative than its cathode, the diode is reverse biased and no current flows through it. During the negative-going excursion the voltage at terminal 212 is more negative than terminal 116 and, therefore, capacitor 107 begins to discharge through the pnpn device 106 and transistor 210 to the right-hand side of capacitor 102. Source 101 goes through a negative-going 300-volt excursion, reaching a maximum negative voltage of −150 volts. The voltage on node 212 is similarly brought through a negative-going 300-volt excursion from −48 volts to a negative-most voltage of approximately −348 volts with respect to ground. Capacitor 107 continues to discharge through pnpn device in the anode-cathode direction and through switching circuit 200, specifically transistor 210.

As the voltage from source 101 begins its next positive-going excursion, the right-hand terminal of capacitor 102 is pulled upward in voltage. The emitter of transistor 210 reaches a voltage higher than that on the collector, and current is conducting through the transistor in the emitter-collector direction. Such reverse conduction is made possible by the fact that the transistor has its base pulled to a more positive voltage than the voltage on either the emitter or collector by operation of resistor 208 which has one terminal connected to ground. The elevated base voltage drives transistor 210 into hard saturation with substantial internal coupling of the transistor's base, collector and emitter functions. Capacitor 207 is sufficiently small that it provides such a high impedance as to have negligible loading effect on the base of transistor 210. The base of transistor 210, therefore, readily follows the emitter during the swings of the alternating voltage of source 101. During the positive-going swings of the alternating voltage, resistor 208 conducts enough base current to both hold transistor 210 in saturation and charge capacitor 207. When capacitor 102 raises the voltage at the emitter of transistor 210 to a level higher than that on the collector, the ensuing effect is one of superimpositioning or an interchange of the collector and emitter functions of transistor 210. The emitter behaves as a collector, and the collector behaves as an emitter, albeit an inefficient emitter due to the geometry of the transistor's construction. Inasmuch as the transistor is in saturation, the inefficiency of the emitter is of small consequence and does not endanger the transistor because small collector-emitter voltage yields small power dissipation.

In this manner, the positive-going charge induced upon the right-hand terminal of capacitor 102 by the positive-going voltage excursion from source 101 generates conventional current which is advantageously conducted through transistor 210 in a seemingly reverse direction. The current cannot, however, conduct through pnpn device 106 in the cathode-anode direction; therefore, it conducts via diode 109 and charges load capacitor 107. The voltage at the terminal 212 increases until it reaches approximately −48 volts, at which time diode 103 becomes forward-biased and conducts the excess charge current to the supply connected at 104.

Due to the RC time constant created by the internal resistances of transistor 210 and diode 109, and the load capacitance, the voltage at terminal 116 phase-lags that on terminal 212 of capacitor 102. Therefore, even though terminal 212 has reached its maximum voltage of −48 volts, some current may continue to flow through transistor 210 and diode 109 until terminal 116 reaches its maximum voltage of −48 volts.

At the instant in time when the voltage at terminal 212 equals the voltage at terminal 116, the current flow stops, and, therefore, the voltage across the collector-emitter terminals of transistor 210 is essentially zero. Thus, if transistor 210 were caused to be opened at this time it would experience no voltage across itself. This is the preferred situation, the conditions of which need not be precisely attained in practice. In some applications of this invention the RC time constant described hereinabove may be greater than the period of a cycle from the source 101. Under these conditions, terminals 212 and 116 might not simultaneously experience −48 volts, and if transistor 210 were to open on or about the positive peak of the waveform from source 101, it would experience a voltage across its collector-emitter terminals due to the RC time lag. Nevertheless, this is an acceptable operation mode so long as the magnitude of the incremental voltage across the collector-emitter terminals is below the punch-through voltage level of the transistor.

B. PEAK-SENSITIVE SWITCHING CIRCUIT 200

An illustrative peak-sensitive switching circuit 200 is schematically illustrated in FIG. 2. As indicated, the essential function of this circuit is to momentarily open the primary current-carrying path on each positive peak of the source 101. The advantage of this arrangement is that there is virtually no voltage across the peak-sensitive switch 200, specifically transistor 210, during the positive peak of source 101. As explained above, at the time of the positive peak, terminals 212 and 116 of the primary current path of the overall switch are substantially at the voltage level established by diodes 103 and 105. Thus, transistor switch 210 opens at a time in the waveform cycle when there is minimum voltage across itself, and it is in saturated conduction at other times.

While transistor 206 is in the off state, the base-emitter junction of transistor 210 is biased by diode 103 which clips the voltage at the emitter of transistor 210 to not exceed the −48 volts at 104 and resistor 208 which connects the base to ground, thereby foward biasing the base-emitter junction of transistor 210 for hard saturated conduction. The collector of transistor 206 is connected to the base of transistor 210 by means of a small capacitor 207. At all times, except during the positive peak of source 101, transistor 206 is biased in the off state by resistor 205, thereby placing nearly all of the supply voltage connected at 213 on the left side of capacitor 207. The right side of capacitor 207 follows the voltage on the base of transistor 210, which is at substantially the same voltage as the emitter-collector of saturated transistor 210, as noted above. As the voltage on the base of transistor 210 swings negatively to about −348 volts, the base current conducted via resistor 208 increases by a factor of approximately seven. The value of resistor 208 is selected so as to prevent excessive base current during the negative-going voltage excursions while still allowing transistor 210 to be held in saturation as the positive-most peak is approached.

Diode 204 references the positive peak of the alternating voltage appearing on the right-hand terminal of capacitor 201 to a direct current voltage comprising the sum of the forward biased voltage drops of diode 204 and the base-emitter diode of transistor 206 in a manner analogous to that by which diode 103 references the right-hand terminal of capacitor 102 to −48 volts. The positive-going signal from source 101 causes the voltage on the right-hand terminal of capacitor 201 to increase positively, and as the positive peak is approached during steady-state operation, diode 204 is forward biased. Charging current from capacitor 201 flows through diode 204 and resistor 205, thereby generating a positive voltage at the base of transistor 206. Charging current also flows through the base-emitter diode of transistor 206, thereby causing the transistor to conduct. The voltage on the right-hand terminal of capacitor 201 is prevented from exceeding the sum of the forward-biased voltage drops of diode 204 and the base-emitter diode of transistor 206. A part of the current which flows through diode 204 is supplied via resistor 202 from the voltage source connected at terminal 213. Sufficient charging current must be supplied via diode 204 to insure that the voltage drop across resistor 205 is sufficient to turn on transistor 206 at a phase point near the peak of the positive cycle of source 101.

Resistor 202 conducts charging current to capacitor 201 during the alternating cycle, causing the voltage on the right-hand terminal of capacitor 201 to increase positively with respect to that on the left-hand terminal. The increase in voltage continues until sufficient charge is collected to cause transistor 206 to conduct. When transistor 206 conducts, capacitor 201 is discharged via diode 204 and the parallel combination of resistor 205 and the base-emitter diode of transistor 206.

The precise phase point at which transistor 206 enters a conductive state is controlled by the amount of charge current supplied to capacitor 201. In this embodiment of the invention, charge current is supplied via resistor 202; however, in some designs the leakage current through reverse biased diode 204 may be sufficient to charge capacitor 201, thereby obviating the need for resistor 202.

When transistor 206 conducts, most of the voltage at point 213 is dropped across resistor 203, thereby causing a significant voltage decrease at the collector of transistor 206. The negative-going transient is transmitted from the collector of transistor 206 via capacitor 207 to the base of transistor 210, thereby temporarily shutting it off. When base current flowing into transistor 206 sufficiently decreases, the transistor shuts off and the voltage at the collector again approaches the voltage at terminal 213. The positive-going transient is transmitted to the base of transistor 210 via capacitor 207, thereby returning transistor 210 to its conductive state.

Although transistor 210 is normally not subjected to overvoltages as just described, overvoltages might occur if a highly reactive load is connected at terminal 116. Zener diode 209 is provided to protect transistor 210 from excessive voltages caused by the excessive phase-lag current resulting from such a case. The zener diode conducts only when such overvoltages are present, and may be omitted in embodiments of the invention in which the operating voltages do not exceed the punch-through voltage level of transistor 210.

C. GATE CONTROL CIRCUIT 300 AND D.C. SUPPLY 400

The illustrative gate control circuit 300 depicted in FIG. 2 is compatible with time-division multiplex (TDM) telephone systems. The chief operative function of this circuit is to bias the gate terminal of the pnpn device 106 with respect to the cathode terminal for either conduction or shut-off in response to control signals. In the illustrative embodiment, the circuit biases the gate terminal for conduction upon the coincidence of proper control signals at input terminals 314(a) and 314(b). Terminal 314(b) receives either high state or low state logic levels from the common control (not shown) of a TDM system, which logic levels determine whether station 122 is to be rung.

Gate control circuit 300 comprises three active switching elements, specifically N-type insulated gate field-effect transistors (IGFETs) 303 and 305 and P-type IGFET 304 in a low-leakage circuit including storage capacitor 306. Gate terminal bias states for pnpn device 106 are established by the conduction states of IGFETs 303 and 304 in response to the electrical charge on capacitor 306 which charges and discharges in response to the logic level present at input 314(b) during application of a select pulse at input 314(a).

Line switch 130 is not a part of this invention, but is an integral element of a TDM telephone system in which this invention may be employed. It is described in detail in R. L. Carbrey U.S. Pat. No. 3,804,989, issued Apr. 16, 1974. One function of the line switch is to provide a periodic select pulse at input 314(a) as shown in the insert identified as 132 in FIG. 2 for defining the time slot assigned the subscriber station 122. The select pulse is transmitted via blocking capacitor 308 to the gate terminal of IGFET 305, thereby enabling the IGFET to conduct. Resistor 307 biases IGFET 305 for shut-off during the intervals between select pulses by providing an electrical path between the gate and substrate terminals. When IGFET 305 is in the conductive state, an electrical path of appropoximately 3 kilo-ohms is closed between capacitor 306 and capacitor 311 at input 314(b).

In addition to issuing periodic select pulses, the line switch is responsive to direct current biasing changes which occur in the subscriber line circuit when the telephone set is taken off-hook in response to a call. A resistive path capable of passing direct current is created between terminals 116 and 117 in FIG. 2 when the telephone is off-hook. Direct current is drawn from ground via resistor 121, diode 119, the telephone set, diode 105 and resistor 111 to the supply connected at 104. The resulting voltage drops across resistors 121 and 111 are sensed by the line switch via diodes 120 and 115, and the line switch informs TDM control of the off-hook status. In response, TDM control places a continuous (high) command signal at input terminal 314(b).

As the direct current passes through the telephone set it is modulated by the carbon microphone (transmitter) in response to the subscriber's vocal patterns. The resulting undulations in the direct current are sensed by the line switch via diodes 120 and 115, amplified, and transmitted by TDM control to the other party.

As stated, IGFET 305 enters a conductive state during application of each select pulse. If during the select pulse a high-level logic signal is placed at input 314(b), capacitor 306 charges positively via IGFET 305, thereby biasing N-type IGFET 303 for conduction and IGFET 304 for shut-off. In its conductive state, IGFET 303 creates an electrical path of approximately 3 kiloohms resistance between the gate terminal of pnpn device 106 and its cathode terminal, consequently biasing the pnpn device for shut-off. On the other hand, should a low-level logic signal be impressed at input 314(b) during a select pulse at 314(a), capacitor 306 will discharge via IGFET 305, causing P-type IGFET 304 to conduct and N-type IGFET 303 to shut off. IGFET 304 creates an electrical path between the gate of pnpn device 106 and the positive voltage lead 315 from D.C. supply 400, thereby biasing the pnpn device for conduction.

As previously mentioned, it is desirable to discontinue the current flow from the source to the load as soon as possible after a discontinuation signal is provided. Immediately after IGFET 303 enters a conductive state, the gate of pnpn device 106 is biased for shut-off, but the latching effect may continue the flow of phase-lag current until it is reliably interrupted by the opening of the peak-sensitive switch 200, specifically transistor 210, during the next peak of source 101. This operation prevents the current flowing through the pnpn device from continuing for more than a fraction of a cycle after the discontinuation command is received.

Zener diodes 301 and 302 are provided to protect IGFET 303 and IGFET 304 from damage-causing overvoltages. The parallel combination of zener diode 309 and resistor 310 prevents the voltage on the otherwise isolated electrical path comprising the left-hand terminal of capacitor 311, the channel of IGFET 305, the right-hand terminal of capacitor 306, and the gates of IGFETs 303 and 304 from floating too far in the negative direction with respect to the voltage supplied by the D.C. supply 400 on lead 315. Thus, the logic state signals transmitted from TDM common control at input terminal 314(b) via capacitor 311 will be at the voltage level required to charge or discharge capacitor 306 and thereby cause IGFETs 303 and 304 to switch states.

The illustrative embodiment of D.C. supply 400 depicted schematically in FIG. 2 contains a square-wave source 401 which is coupled via capacitors 402 and 403 to a full-wave rectification bridge containing diodes 404, 405, 407, and 408. The output voltage is filtered by filter capacitor 406. As indicated, this D.C. supply provides a direct current voltage to be applied across the gate and cathode terminals, thereby biasing pnpn device 106 for conduction where the signal at terminals 314(a) and 314(b) are such as to cause IGFET 304 to enter a conductive state.

The concept disclosed herein contains an economically advantageous feature wherein plural loads may be serviced by a single alternating current supply without replication of all the subcircuits. Line taps 110, 112, 113, 114, 320 and 321 in FIG. 2 indicate where plural gate control circuits 300, pnpn devices 106, diodes 105 and resistors 111 may be connected. Peak-sensitive switching circit 200, D.C. supply 400, the supply connected at point 104 and the common control input at terminal 314(b) with capacitor 311, diode 309 and resistor 310 need not be replicated and can each service a plurality of gate control circuits 300 with their associated pnpn devices, loads and diodes. This feature renders the invention especially suitable for applications such as telephone systems wherein many telephone set ringers are supplied current from a single power source.

It is to be remembered that, although the inventive concept disclosed herein is described in terms of specific embodiments and particular applications, persons skilled in the pertinent art can generate additional embodiments without departing from the spirit or exceeding the scope of the invention. The block, line, and schematic illustrations depicted in FIGS. 1 and 2 are merely illustrative embodiments proferred to facilitate comprehension of the invention, and should not be construed to limit the scope thereof.

What is claimed is:

1. A switching circuit for interrupting cyclically varying signals comprising
   at least one first switching device connected in series with a second switching device each first and second switching device having at least first, second and third terminals, the first terminal of each first switching device connected to the second terminal of the second switching device, each first switching device conducting an electric current in one direction along an internal electrical path between its first and second terminals which electrical conduction is initiated by application of enabling signals to the third terminal and discontinued by application of disabling signals to the third terminal when the electric current flowing through the internal electrical path is below a predetermined level, and
   a circuit for periodically opening the second switching device during a fraction of a cycle of preselected polarity of the cylically varying signals to ensure discontinuation of the electric current flowing through the first switching device in response to the disabling signals.

2. A circuit in accordance with claim 1 in which each first switching device comprises
   a pnpn device having cathode, anode and gate terminals, which terminals respectively comprise the first, second and third terminals.

3. A switching circuit in accordance with claim 1 in which the cyclically varying signals have such an average voltage level as to be bipolar, the switching circuit further comprising
   means for shifting the average voltage level of an electrical path comprising the series first and second switching devices so as to convert the cyclically varying bipolar signals into cyclically varying direct current voltages on the electrical path comprising the series first and second switching devices.

4. A switching circuit in accordance with claim 3 in which the means for shifting the operating voltage level of the electrical path comprising the series first and second switching devices comprises
   a first diode connected to the second terminal of the first switching device for clipping the voltage on the second terminal thereby preventing the voltage from exceeding a predetermined level, and
   a second diode connected to the first terminal of the second switching device for clipping the voltage on the first terminal thereby preventing the voltage from exceeding a predetermined level.

5. A switching circuit in accordance with claim 1 in which the second switching device comprises
   a first transistor having an internal electrical path between collector and emitter terminals in series with the first switching device and a base terminal for receiving signals from the circuit for periodically opening the second switching device, which emitter, collector and base terminals respectively comprise the first, second and third terminals of the second switching device.

6. A switching circuit in accordance with claim 1 wherein the circuit for periodically opening the second switching device comprises
   a third switching device having an internal electrical path between first and second terminals for conducting a direct current, which conduction is controlled by enabling and disabling signals received at a third terminal, which enabling and disabling signals are responsive to periodic peaks of preselected polarity of the cyclically varying signals, and
   means for delivering signals generated by the controlled conduction through the third switching device to the third terminal of the second switching device thereby periodically opening and closing the second switching device.

7. A circuit in accordance with claim 6 wherein the third switching device comprises
   a second transistor having collector, base and emitter terminals, which terminals comprise the first, second and third terminals respectively of the third switching device, and
   the means for delivering a signal to the third terminal of the second switching device comprising a capacitor, one terminal of which is connected to the collector of the second transistor and the other terminal to the third terminal of the second switching device for delivering a signal on the collector of the second transistor, which signal is responsive to the enabling and disabling signals at the base of the second transistor, to the third terminal of the second switching device for opening and closing the second switching device.

8. A switching circuit for interrupting cyclically varying signals having such an average voltage level as to be bipolar comprising
   a first switching device having at least first, second and third terminals for conducting an electrical signal in one direction along an internal electrical path between the first and second terminals, which electrical conduction is initiated by application of enabling signals to the third terminal and discontinued by application of disabling signals when the electric current flowing through the internal electrical path is below a predetermined level, and
   means for shifting the average voltage level of the electrical path between the first and second terminals so as to convert the cyclically varying bipolar signal into cyclically varying direct current voltage having a waveshape substantially similar to that of the bipolar signal.

9. A circuit in accordance with claim 8 in which the first switching device comprises
   a pnpn device having cathode, anode and gate terminals, which terminals respectively comprise the first, second and third terminals.

10. A switching circuit in accordance with claim 8 further comprising
    a second switching having an internal electrical path between first and second terminals, which electrical path is connected in series with the internal electrical path of the first switching device and operated at the shifted voltage level, the second switching device further having at least a third terminal for receiving signals, and
    a circuit connected to the third terminal of the second switching device for periodically opening the second switching device in response to a periodic peak of preselected polarity of the cyclically varying bipolar signals to ensure discontinuation of the current flowing through the internal electrical path of the first switching device in response to the disabling signals.

11. A switching circuit in accordance with claim 10 in which the second switching device comprises
    a first transistor having an internal electrical path between collector and emitter terminals in series with the first switching device and a base terminal for receiving signals from the circuit for periodically opening the second switching device.

12. A circuit in accordance with claim 8 in which the means for shifting the average voltage level of the electrical path between the first and second terminals of the first switching device comprises
    first and second diodes respectively connected to the first and second terminals for clipping the voltage on the terminals thereby preventing the voltage from exceeding a predetermined level.

13. A switching circuit in accordance with claim 10 wherein the circuit for periodically opening the second switching device comprises
    a third switching device having an internal electrical path between first and second terminals for conducting a direct current, which conduction is controlled by enabling and disabling signals received at a third terminal,
    means responsive to periodic peaks of preselected polarity of the cyclically varying signals for enabling and disabling the third switching device, and
    means for delivering signals generated by the controlled conduction through the third switching device to the third terminal of the second switching device thereby periodically opening and closing the second switching device.

14. A circuit in accordance with claim 13 wherein the third switching device comprises
    a second transistor having collector, emitter and base terminals, which terminals are analogous to the first, second and third terminals, respectively, and
    the means for delivering a signal to the third terminal of the second switching device comprising a capacitor, one terminal of which is connected to the collector of the second transistor and the other terminal to the third terminal of the second switching device, for delivering a signal on the collector of the second transistor, which signal is responsive to the enabling and disabling signals at the base of the second transistor, to the third terminal of the second switching device for opening and closing the second switching device.

15. A circuit for applying enabling and disabling signals to a switching device having at least first, second and third terminals for conducting an electric current along an internal electrical path between the first and second terminals comprising means for receiving first and second control signals at plural input terminals, means for producing logic state voltages responsive to the first and second control signals, means for storing the logic state voltages, means for cooperating with the means for storing to provide a direct current voltage across the first and third terminals of the switching device and thereby enabling the switching device in response to a predetermined logic state voltage, and means for cooperating with the means for storing to close an electrical path between the first and third terminals of the switching device and thereby disabling the switching device in response to a predetermined logic state voltage.

16. A circuit in accordance with claim 15 in which the means for producing logic state voltages comprises a first IGFET device having at least first, second and control terminals, means for connecting the control terminal to a terminal for receiving the first control signal, which signal defines a periodic time slot during which time slot the second control signal is received for determining whether an enabling or disabling signal is provided to the switching device, and means for applying the second control signal to the first terminal of the first IGFET device, which second control signal is conducted through the first IGFET device during the time slot defined by the first control signal to a capacitor connected to the second terminal of the first IGFET, which capacitor comprises the means for storing the logic state voltages.

17. A circuit in accordance with claim 15 in which the means for providing a direct current voltage across the first and third terminals of the switching device comprises a second IGFET device having at least first, second and control terminals, means for connecting the control terminal to the second terminal of the first IGFET device, which control terminal receives logic state signals responsive to the first and second control signals, a direct current voltage supply connected across the first terminal of the switching device and the second terminal of the second IGFET device for providing an enabling bias voltage to the switching device, and means for connecting the first terminal of the second IGFET device to the third terminal of the switching device so as to provide the enabling bias voltage to the third terminal of the switching device in response to the logic state signal at the control terminal of the second IGFET device.

18. A circuit in accordance with claim 15 in which the means for closing an electrical path between the first and third terminals of the switching device comprises a third IGFET device having at least first, second and control terminals, means for connecting the control terminal to the second terminal of the first IGFET device, which control terminal receives logic state signals responsive to the first and second control signals, and means for connecting the first and second terminals of the third IGFET device to the first and third terminals, respectively, of the switching device for providing an electical path between the first and third terminals of the switching device responsive to the logic state signals at the control terminal of the third IGFET device, which responsive electrical path disables the switching device.

* * * * *

UNITED STATES PATENT AND TRADEMARK OFFICE
CERTIFICATE OF CORRECTION

PATENT NO. : 4,037,117
DATED : July 19, 1977
INVENTOR(S) : Robert L. Carbrey

It is certified that error appears in the above-identified patent and that said Letters Patent are hereby corrected as shown below:

Column 1, line 33, "oerat-" should read --operat- --.

2, 42, after "rents" insert a period.

8, 51, "appropoximately" should read --approximately--;

67, "continuous" should read --discontinuation--.

Claim 10, 3, after "switching" insert --device--.

Signed and Sealed this

*Twenty-second* Day of *November 1977*

[SEAL]

Attest:

RUTH C. MASON
*Attesting Officer*

LUTRELLE F. PARKER
*Acting Commissioner of Patents and Trademarks*